United States Patent [19]
Wyatt

[11] Patent Number: 5,909,147
[45] Date of Patent: Jun. 1, 1999

[54] AMPLIFIER HAVING DC COUPLED GAIN STAGES

[75] Inventor: Michael A. Wyatt, Clearwater, Fla.

[73] Assignee: Honeywell Inc., Minneapolis, Minn.

[21] Appl. No.: 08/934,029

[22] Filed: Sep. 19, 1997

[51] Int. Cl.$^6$ ....................................................... H03F 3/191
[52] U.S. Cl. ............................................. 330/306; 330/311
[58] Field of Search .................................. 330/302, 303, 330/306, 310, 311; 327/557

[56] References Cited

U.S. PATENT DOCUMENTS

| | | | |
|---|---|---|---|
| 3,355,669 | 11/1967 | Avins | ................................... 330/306 X |
| 4,371,846 | 2/1983 | Gamble | ................................ 330/306 X |
| 5,126,689 | 6/1992 | Nakamura | ............................ 330/311 X |

*Primary Examiner*—Steven J. Mottola
*Attorney, Agent, or Firm*—Vincent A. Branton

[57] ABSTRACT

An RF amplifier has multiple DC coupled gain stages which generate an output signal by amplifying an input RF signal. All of the transistors are NPN and directly coupled through filters. The amplifier input and output stages actively match the impedance of the RF source and load.

1 Claim, 1 Drawing Sheet

5,909,147

AMPLIFIER HAVING DC COUPLED GAIN STAGES

This invention was made with Government support under contract MDA904-95-C-2705 awarded by the U.S. Department of the Army to Honeywell Inc. and the Government has certain rights in this invention.

TECHNICAL FIELD

The present invention relates to amplifiers, and more particularly, radio frequency (RF) amplifiers.

BACKGROUND OF THE INVENTION

The need for speed-bandwidth has affected literally all aspects of electronic design. Many designers have responded by taking advantage of the inherent speed of NPN transistors, as compared to PNP transistors. NPN transistors circuit have improved speed and overall gain. However, despite the inherent advantages of NPN transistors, high gain RF amplifiers using them continue to couple amplifier stages with capacitors (AC coupling), decreasing amplifier efficiency by placing an additional load in the output circuits of each stage.

Beyond that, DC coupling in integrated circuits requires the fabrication and connection of capacitors in close proximity to other components on the same substrate, creating so-called parasitic capacitance, which degrades amplified performance and stability in an unpredictable way, complicating circuit layout.

DISCLOSURE OF THE INVENTION

It is an object of the present invention to provide a fast, low power, efficient high gain RF amplifier According to the invention, an AC signal drives the base of a transistor, producing collector current that drives the emitter of a second transistor that has a tuned or tank circuit for collector current. The voltage across the tank circuit is DC coupled to one input of a differential amplifier comprising a pair of NPN transistors. The non-inverted output of the differential amplifier contains another tank circuit and the voltage on this tank circuit is DC coupled to driver connected to a load.

According to the invention, the base of one differential amplifier transistor is connected to the collector of the other differential amplifier transistor.

One of the features of the present invention is that it provides high gain with relatively low power consumption, particularly if NPN transistors are used.

Another feature of the present invention is that it minimizes parasitic losses caused by stray capacitance and mismatched line impedance values between the source, the amplifier, and the load.

A further feature of the present invention is that it provides high reverse isolation.

Further objects, benefits, and features of the present invention will become apparent to one of ordinary skill in the art from the drawings and description of the preferred embodiments contained and disclosed herein.

BEST MODE FOR CARRYING OUT THE INVENTION

Figure 1:
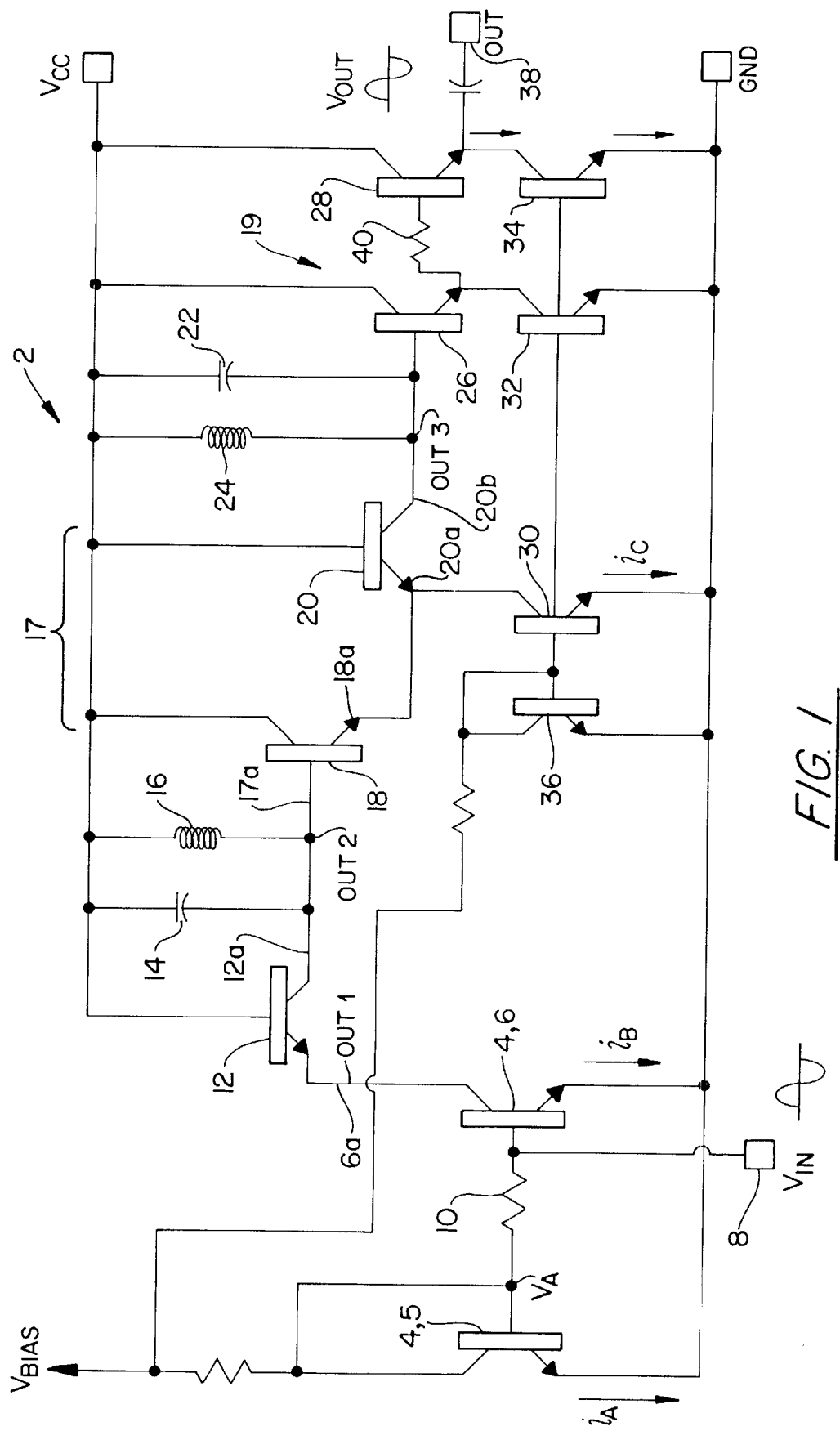
FIG. 1 is a schematic of the amplifier circuit embodying the present invention.

Referring to FIG. 1, an RF amplifier 2 has an input current mirror with two NPN transistors 4. One current mirror transistor 5 is a bias transistor that establishes an input reference current, $i_A$, and an input reference voltage, $V_A$, when a bias voltage supply, $V_{BIAS}$, is high. The other current mirror transistor 6 is a gain transistor that shares the input reference voltage, $V_A$, with the bias transistor 5. An input node 8 and a base resistor 10 are located between the bias transistor 4 and the gain transistor 6, which responds to an input, $V_{IN}$, at input or node 8 with an output signal, Out 1, on its collector 6a. The base resistor 10 is positioned on the bias transistor 4 side of the input 8, and the value of resistor 10 is selected to reduce the sensitivity of transistor 5 to the signal $V_{IN}$ so that the input signal $V_{IN}$ drives transistor 6, not transistor 5. (However, the base resistor 10 should not significantly decrease the magnitude of the reference voltage, $V_A$, from the base of the bias transistor 5 to the base of the gain transistor 6.)

The signal Out 1 produces base current in a second NPN transistor 12, producing amplified current in the collector 12a that flows through a tank circuit (filter) comprising capacitor 14 and inductor 16. This current produces a voltage across the tank circuit, signal Out 2. The tank circuit connects the power supply VCC to the collector 12a, providing a low impedance to ground. The second gain transistor 12 is biased by the input current mirror gain transistor 6. The input gain transistor 6 develops a bias current, $i_B$, that is proportional to the input reference current, $i_A$. Since the base of the second gain transistor 12 is connected to a DC supply voltage, VCC, a base-to-emitter voltage drop is created that biases the second gain transistor 12 "ON." The filter inductor 16 also serves to complete the path for the DC bias current, $i_B$, flowing through the inductor 16, the second gain transistor 12 and the input gain transistor 6.

The signal Out 2 is applied to one input 17a of a differential amplifier 17, comprising two NPN transistors 18, 20, and this produces an amplified, but inverted, current signal Out 3 in the collector 20b. The collector 20b is connected the supply VCC through a second filter or tank circuit, inductor 24 in parallel with capacitor 22, and current produces a voltage, Out 3, at collector 20b. The signal Out 2 directly proportional (non-inverted) to signal Out 2 but amplified by the gain of the differential amplifier 17.

The second filter, like the first filter, is also a tuned network having a parallel connected capacitor 22 and inductor 24. Both filters ideally are tuned to the same frequency. The second filter provides additional signal selectivity (i.e., narrower bandwidth)

A cascade emitter follower 19 output signal, $V_{OUT}$ in response to signal Out 3. The emitter follower 19 has two stages, a first stage with an input NPN transistor 26 and a second stage, also an NPN transistor 28. The signal $V_{out}$ appears on the emitter of transistor 28.

Both emitters 18a, 20a on the transistors 18, 20 are tied together and connected to a constant current source that includes a second current mirror with daisy-chained NPN mirror transistors 30, 32, 34 to bias the differential amplifier and the two stages of the output 19. The operation of the second current mirror is similar to that of the input current mirror. Half of the differential amplifier current, $i_c$, is developed through the differential input transistor 18 while the other half is developed through the differential output transistor 20 and the second filter inductor 24. Each stage of the output cascade is biased with a mirror transistor 32, 34 that is responsive to the second current mirror bias transistor 36.

The RF amplifier 2 has an architecture that biases the second gain transistor 12 and the differential output transistor 20 with a base-to-collector voltage approaching zero volts. To avoid degradation of the bias the differential input transistor 18 must also have a base-to-collector voltage approaching zero volts. This is accomplished by using the shunt inductance 16 of the first filter network to transfer the DC supply voltage, VCC, to the base of the differential input transistor 18.

The need for a separate, decoupled RF voltage supply is eliminated by attaching the bases of the second gain transistor 12 and the differential output transistor 20 to the DC supply voltage, VCC. This configuration also produces high RF gain.

The cascade emitter follower buffers the collector of the differential output transistor 20 from a load connected to an output node 38. The impedance of the RF amplifier 2 at the output node 38 is controlled by an output base resistor 40 and the emitter current, $i_D$, in the emitter of the cascade output transistor 28 to match the impedance of a connected load. Similarly, the base resistor 10 located in the input current mirror and the emitter current, $i_A$, of the input bias transistor 4 are controlled to match the impedance of a connected RF signal source.

For illustrative purposes, NPN transistors have been used exclusively in this invention. However, one of ordinary skill in the art will appreciate that other active devices may be substituted. If other devices are substituted, one of ordinary skill in the art will also appreciate that, although the devices and the gain stages may remain DC coupled, certain desirable aspects of amplifier performance will decline, i.e., speed, capacitive loading, tuning, etc.

With the benefit of the previous discussion of the invention, one of ordinary skill in the art may be able to modify the invention, and the functions and functional elements described above, in whole or in part, without departing from the true scope and spirit of the invention.

What is claimed is:

1. An amplifier characterized by:

a first transistor;

a first filter connecting a base and a collector on the first transistor and comprising an inductor in parallel with a capacitor;

a differential amplifier comprising a second transistor and a third transistor, said amplifier producing increased collector current in the third transistor in response to an increase in base current in a base of the second transistor;

a second filter connecting the collector and base of the third transistor and comprising an inductor in parallel with a capacitor;

an output stage comprising a fourth transistor having its base connected to the collector of the third transistor and its emitter DC coupled to the base of a fifth transistor for producing current in the collector of the fifth transistor in response to the voltage across the second filter, the emitter of the fifth transistor being the output for the amplifier;

a sixth transistor having its collector DC coupled to the emitter of the first transistor, the base of the sixth transistor being the input for the amplifier;

current mirrors for producing equal bias currents in the emitter of the second, third, fourth and fifth transistors and comprising transistors with the junction polarity of the first transistor;

the first, second, third, fourth, fifth and sixth transistors and the transistors comprising the current mirrors all having the same junction polarity.

* * * * *